United States Patent [19]

Vogelzang

[11] Patent Number: 5,497,026
[45] Date of Patent: Mar. 5, 1996

[54] SEMICONDUCTOR DEVICE WITH IMPROVED BREAKDOWN VOLTAGE CHARACTERISTICS

[75] Inventor: Dirk A. Vogelzang, Nijmegen, Netherlands

[73] Assignee: U.S. Philips Corporation, New York, N.Y.

[21] Appl. No.: 372,699

[22] Filed: Jan. 13, 1995

Related U.S. Application Data

[63] Continuation of Ser. No. 202,719, Feb. 23, 1994, abandoned, which is a continuation of Ser. No. 907,422, Jul. 1, 1992, abandoned.

[30] Foreign Application Priority Data

Jul. 2, 1991 [EP] European Pat. Off. ............. 91201690

[51] Int. Cl.⁶ .......................... H01L 23/58; H01L 23/48
[52] U.S. Cl. ...................... 257/487; 257/493; 257/494; 257/495; 257/544; 257/786
[58] Field of Search .......................... 257/487, 492–495, 257/544–547, 550, 786, 676, 459

[56] References Cited

U.S. PATENT DOCUMENTS 3,812,521   8/1974   Davis et al. ........................... 257/546
4,750,028  12/1988   Ludikhuize ........................... 257/495

FOREIGN PATENT DOCUMENTS 53-83472   7/1978   Japan ..................................... 257/546
64-84733   3/1989   Japan ..................................... 257/544

Primary Examiner—J. Carroll
Attorney, Agent, or Firm—Steven R. Biren

[57] ABSTRACT

A semiconductor device includes a semiconductor body (1, 2) with an island-shaped region (3) adjoining the surface, in which a contact pad (6) is provided above the island-shaped region (3) and separated therefrom by an insulating layer (5). The island-shaped region (3) forms a pn-junction (34) with an adjoining isolating region (4). According to the invention, the device is provided with regions (40, 41) for increasing the breakdown voltage of the pn-junction (34).

3 Claims, 1 Drawing Sheet

5,497,026

SEMICONDUCTOR DEVICE WITH IMPROVED BREAKDOWN VOLTAGE CHARACTERISTICS

This is a continuation of application Ser. No. 08/202,719, filed Feb. 23, 1994, abandoned, which is a continuation of Ser. No. 07/907,422, filed Jul. 1, 1992, now abandoned.

BACKGROUND OF THE INVENTION

The invention relates to a semiconductor device comprising a semiconductor body with an island-shaped region of a first conductivity type adjoining the surface and surrounded by an isolating region of a second, opposite conductivity type with which the island-shaped region forms a pn-junction, the island-shaped region being covered by an insulating layer on which a contact pad is provided.

Such a device is known from U.S. Pat. No. 3,812,521. This reference describes a device in which the contact pad is separated from a p-type island-shaped region by a silicon oxide layer. The p-type island-shaped region lies in an island-shaped n-type isolating region with which it forms a pn-junction. In the known device, the n-type isolating region is in its turn surrounded by a p-type isolating region which is in electrical contact with the substrate.

It was found in practice that a device of the kind described frequently gives rise to failures in applications for higher voltages. The known device, therefore, has the disadvantage that it cannot be reliably utilized for higher voltages.

SUMMARY OF THE INVENTION

The invention has for its object inter alia to counteract this disadvantage by providing a device of the kind described in the opening paragraph which can be reliably used at higher voltages.

According to the invention, a device of the kind described in the opening paragraph is for this purpose characterized in that the device is provided with means for increasing the breakdown voltage of the pn-junction between the island-shaped region and the adjoining semiconductor region.

The invention is based on the recognition that, when a short-circuit arises between the contact pad and the island-shaped region, the voltage at the contact pad is applied fully across the pn-junction between the island-shaped region and the isolating region, so that the pn-junction must be able to withstand the voltage offered at the contact pad.

Such a short-circuit may be due, for example, to fastening of a metal wire to the contact pad. Pressure is usually exerted on the contact pad during this operation, so that stresses are introduced into the subjacent insulating layer, and small cracks may arise. A short-circuit between the contact pad and the island-shaped region is possible through such a crack. This problem arises especially when the insulating layer between the contact pad and the island-shaped region is comparatively resilient, for example, in that the layer was not grown but deposited by means of gas-phase deposition, which is a usual technique in semiconductor technology for providing a layer.

The breakdown voltage increasing means in the device according to the invention ensure that the pn-junction between the island-shaped region and the isolating region is able to withstand the voltage which is present at the contact pad during operation. As a result, the device according to the invention will still continue to function reliably, even in the case of any short-circuit in the insulating layer.

BRIEF DESCRIPTION OF THE DRAWING

The invention will now be explained in more detail with reference to the drawing, in which.

Figure 1:
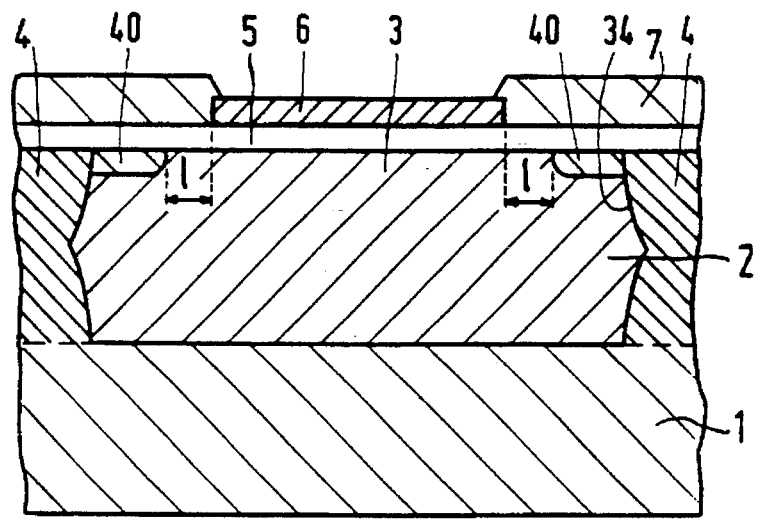
FIG. 1 is a cross-section of a first embodiment of the device according to the invention.

The Figures are purely diagrammatic and not drawn to scale. In particular, some dimensions are shown on a strongly exaggerated scale for the sake of clarity. Semiconductor regions of the same conductivity type are generally hatched in the same direction, and corresponding parts are given the same reference numerals.

DESCRIPTION OF THE PREFERRED EMBODIMENTS

The device of FIG. 1 comprises a semiconductor body with a p-type substrate of silicon and a superimposed n-type epitaxial layer 2 with an average phosphorus concentration of $6.10^{14}$ cm$^{-3}$. The epitaxial layer 2 comprises a number of island-shaped regions 3 which are each surrounded by a p-type isolating region 4 with an average boron concentration of approximately $5.10^{19}$ cm$^{-3}$ which extends from the surface to the substrate 1. The isolating region may be formed, for example, through a combination of diffusion from the surface and from a buried layer.

On the surface there is an approximately 2.5 μm thick silicon oxide layer of which approximately 0.1 μm was grown thermally on the surface, but the remaining portion was provided by gas-phase deposition (CVD). A contact pad 6 of aluminum with dimensions of approximately 100×100 μm$^2$ is provided on the oxide layer 5 in the location of an island-shaped region 3. The contact pad 6 is connected to a switching element situated elsewhere in the semiconductor body by means of an aluminum conductor track outside the plane of the drawing.

To protect the device, the entire assembly is coated with a protective top layer 7 of silicon nitride in which a window is provided at the area of the contact pad 6. A contact wire may be fastened on the contact pad 6 in the window in order to connect the device to a lead of a lead frame (not drawn). It is alternatively possible that only a small metal elevation is provided on the contact pad, a so-called bump, whereby the device can be mounted directly on a lead frame or a tape.

In all these cases, pressure is exerted on the contact pad 6, so that stresses are introduced into the subjacent insulating layer 5. As a result of these, cracks may arise which may cause a short-circuit between the contact pad 6 and the island-shaped region 3. In that case the voltage offered at the contact pad is applied fully across the pn-junction 34 between the island-shaped region 3 and the surrounding isolating region 4. This problem arises especially when the insulating layer was provided by means of a deposition technique, as in the present case. In contrast to grown layers, deposited layers are usually comparatively resilient, so that the layer will quickly break if pressure is exerted on it locally.

To counteract undesirable consequences of such a short-circuit, the device according to the invention is provided with means for increasing the breakdown voltage of the pn-junction 34 between the island-shaped region 3 and the isolating region 4. In this example, the breakdown voltage increasing means comprise a lateral extension 40 of the isolating region 4 adjoining the surface with a comparatively low doping concentration of approximately $5.10^{16}$ cm$^{-3}$. The extension 40 extends approximately 30 μm into the island-shaped region 3, maintaining a distance l of approximately 20 μm from the contact pad 6.

In practice, a pn-junction such as the pn-junction 34 surrounding the island-shaped region 3 and situated transverse to the surface is found to be most susceptible to breakdown near the surface. To increase the breakdown voltage of the pn-junction 34, therefore, it is especially necessary to reduce the electric field around the pn-junction 34. The extension 40 accomplishes this. As a result of this extension, the depletion region which surrounds the pn-junction 34 during operation is considerably wider near the surface, so that the electric field is weakened. Without such an extension the pn-junction 34 in this example would not be able to withstand voltages above 170 V; with the extension voltages up to 300 V can be accommodated without problems.

Figure 2:
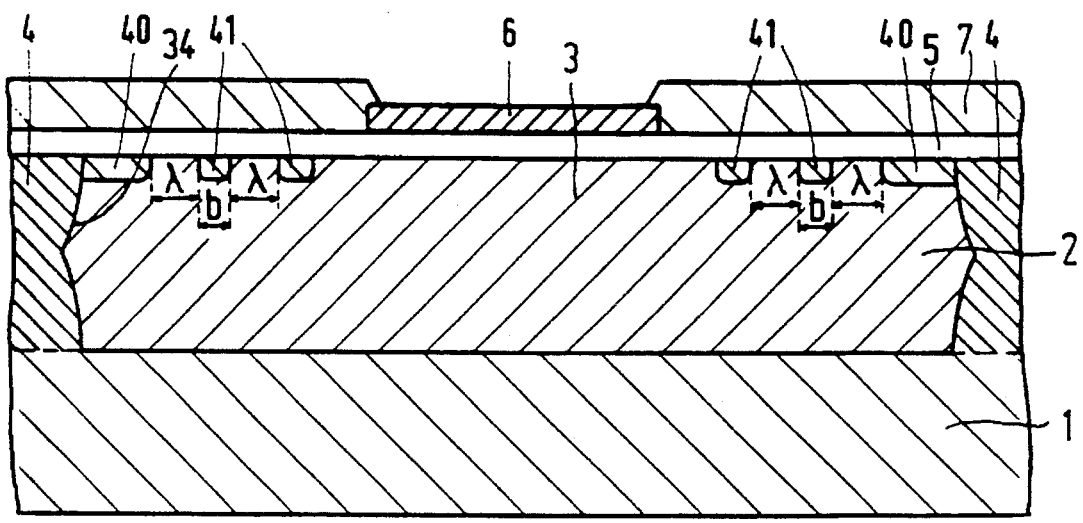
FIG. 2 is a cross-section of a second embodiment of the device according to the invention.

The device of FIG. 2 largely corresponds to that of FIG. 1, the difference being that in this second embodiment of the device according to the invention the breakdown voltage increasing means comprise not only a lateral extension 40 of the isolating region 4, but also a number of p-type zones 41 adjoining the surface. The p-type zones 41 lie in the island-shaped region 3, forming narrow rings therein which entirely surround the contact pad. The zones have a width b of approximately 6 μm and can be applied in the same process step as the extension 40.

The interspacing λ between the zones 41 and between the zones 41 and the extension 40 is approximately 6 μm, sufficiently small to ensure that during operation the depletion regions around the surface zones 41 and around the pn-junction 34 mutually overlap. As a result, the depletion region around the pn-junction 34 is further widened at the surface, so that the electric field strength in the depletion region drops still further. This results in a further increase in the breakdown voltage of the pn-junction 34. In the device shown here, the pn-junction 34 was found to resist voltages of more than 1400 V.

Although the invention was described with reference to only two embodiments, it will be apparent that the invention is by no means restricted to the embodiments given. Many more variations are possible for those skilled in the art within the scope of the invention. Thus, in the examples given, the conductivity types may all be simultaneously replaced by the opposite conductivity types. In addition, those skilled in the art, within the scope of their skills, are aware of alternative breakdown voltage increasing measures which may be taken in the device according to the invention. Thus, for example, the so-called RESURF principle may be used in suitable locations in the device for further increasing the breakdown voltage of the pn-junction.

I claim:

1. A semiconductor device comprising a semiconductor body with an electrically-isolated island-shaped region of a first conductivity type adjoining a surface of the semiconductor body and being surrounded by an isolating region of a second, opposite conductivity type with which the island-shaped region forms a pn-junction, and means for maintaining said electrically-isolated island-shaped region at a floating potential, said means comprising the electrically-isolated island-shaped region being completely covered by a continuous insulating layer on which a contact pad is provided, the lateral extent of said contact pad being less than the lateral extent of said island-shaped region in all directions; and the device being provided with means for increasing the breakdown voltage of the pn-junction between the island-shaped region and the isolating region, said means being everywhere laterally spaced from said contact pad and extending around the periphery of said island-shaped region.

2. A semiconductor device as claimed in claim 1, characterized in that the means comprise a lateral extension of the isolating region, which extension adjoins the surface, extends from a main portion of the isolating region into the island-shaped region, and has a lower doping concentration than the main portion of the isolating region.

3. A semiconductor device as claimed in claim 1, characterized in that the means comprise a number of spaced-apart zones of the second conductivity type adjoining the surface, which zones are provided in the island-shaped region and are entirely surrounded by the island-shaped region in the semiconductor body.

\* \* \* \* \*